US012729334B2

(12) United States Patent
Matsubara et al.

(10) Patent No.: US 12,729,334 B2
(45) **Date of Patent: *Sep. 8, 2026**

(54) CURABLE COMPOSITION SET AND ARTICLE

(71) Applicant: Resonac Corporation, Tokyo (JP)

(72) Inventors: Nozomi Matsubara, Tokyo (JP); Yuki Nakamura, Tokyo (JP); Naoki Furukawa, Tokyo (JP); Hiroshi Yokota, Tokyo (JP); Tsuyoshi Morimoto, Tokyo (JP)

( * ) Notice: Subject to any disclaimer, the term of this patent is extended or adjusted under 35 U.S.C. 154(b) by 854 days.

This patent is subject to a terminal disclaimer.

(21) Appl. No.: 17/779,130

(22) PCT Filed: Nov. 26, 2020

(86) PCT No.: PCT/JP2020/043978
§ 371 (c)(1),
(2) Date: May 24, 2022

(87) PCT Pub. No.: WO2021/106992
PCT Pub. Date: Jun. 3, 2021

(65) Prior Publication Data

US 2023/0016868 A1 Jan. 19, 2023

(30) Foreign Application Priority Data

Nov. 29, 2019 (JP) ................................ 2019-216616
Feb. 6, 2020 (JP) ................................ 2020-019070

(51) Int. Cl.

| | |
|---|---|
| ***C09K 5/14*** | (2006.01) |
| ***C08F 222/10*** | (2006.01) |
| ***C08F 290/06*** | (2006.01) |
| ***C08K 3/08*** | (2006.01) |
| ***C08K 3/22*** | (2006.01) |
| ***C08K 5/13*** | (2006.01) |
| ***C08K 13/02*** | (2006.01) |
| ***H05K 7/20*** | (2006.01) |

(52) U.S. Cl.
CPC .......... *C09K 5/14* (2013.01); *C08F 222/1063* (2020.02); *C08F 290/062* (2013.01); *C08K 3/08* (2013.01); *C08K 3/22* (2013.01); *C08K 5/13* (2013.01); *C08K 13/02* (2013.01); *C08K 2003/0812* (2013.01); *C08K 2003/2227* (2013.01); *C08K 2201/001* (2013.01); *H05K 7/2039* (2013.01)

(58) Field of Classification Search
None
See application file for complete search history.

(56) References Cited

U.S. PATENT DOCUMENTS 5,415,896 A 5/1995 Mulvihill et al.
5,660,178 A 8/1997 Kantner et al.
6,274,688 B1 * 8/2001 Nakagawa ............ G01J 3/2823 526/346
9,493,682 B2 11/2016 Levandoski et al.
2003/0203011 A1 10/2003 Abuelyaman et al.
2006/0122298 A1 * 6/2006 Menon .................... A61L 15/58 524/556
2010/0101724 A1 * 4/2010 Schuft ................... C08F 220/14 524/13
2010/0331462 A1 * 12/2010 Levandoski ........... C09J 153/02 524/505
2013/0165593 A1 6/2013 Ichiryu et al.
2013/0298398 A1 11/2013 Miyasaka et al.
2014/0220243 A1 * 8/2014 Levandoski ............... C09J 9/02 252/511
2015/0153647 A1 6/2015 Itagaki et al.
2022/0403081 A1 12/2022 Furukawa et al.
2022/0403082 A1 12/2022 Matsubara et al.
2023/0002661 A1 * 1/2023 Nakamura ............... C08K 3/22
2023/0016868 A1 1/2023 Matsubara et al.

(Continued)

FOREIGN PATENT DOCUMENTS

CN 1101065 4/1995
CN 101087860 12/2007

(Continued)

OTHER PUBLICATIONS

Soei Patent and Law Firm, Statement of Related Matters, dated Jun. 24, 2022.

(Continued)

*Primary Examiner* — Katarzyna I Kolb
(74) *Attorney, Agent, or Firm* — SHIPWAY IP

(57) ABSTRACT

A curable composition set containing: a first liquid containing an oxidizing agent; and a second liquid containing a reducing agent, wherein at least one of the first liquid and the second liquid contains a compound represented by the following formula (1):

(1)

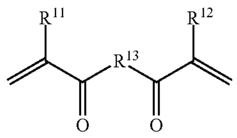

wherein $R^{11}$ and $R^{12}$ each independently represent a hydrogen atom or a methyl group, and $R^{13}$ represents a divalent group having a polyoxyalkylene chain, and wherein at least one of the first liquid and the second liquid contains a thermally conductive filler.

13 Claims, 2 Drawing Sheets

(56) References Cited

U.S. PATENT DOCUMENTS

| | | | | |
|---|---|---|---|---|
| 2024/0052077 | A1* | 2/2024 | Terauchi | C08F 2/44 |
| 2024/0132645 | A1 | 4/2024 | Furukawa et al. | |
| 2024/0132646 | A1 | 4/2024 | Furukawa et al. | |
| 2024/0368319 | A1* | 11/2024 | Ito | C08F 220/18 |

FOREIGN PATENT DOCUMENTS

| | | |
|---|---|---|
| CN | 101343527 | 1/2009 |
| CN | 101392042 | 3/2009 |
| CN | 102712814 | 10/2012 |
| CN | 104053737 | 9/2014 |
| CN | 104303106 | 1/2015 |
| CN | 104974694 | 10/2015 |
| CN | 107710385 | 2/2018 |
| CN | 109504351 | 3/2019 |
| CN | 109562597 | 4/2019 |
| CN | 110706926 | 1/2020 |
| CN | 113302734 | 8/2021 |
| GB | 2582002 | 9/2020 |
| JP | S64-065112 | 3/1989 |
| JP | H1-190711 | 7/1989 |
| JP | H6-157667 | 6/1994 |
| JP | H7-322962 | 12/1995 |
| JP | H8-504853 | 5/1996 |
| JP | H11-080723 | 3/1999 |
| JP | H11-246885 | 9/1999 |
| JP | 2001-192425 | 7/2001 |
| JP | 2004-026971 | 1/2004 |
| JP | 2004-168740 | 6/2004 |
| JP | 2004-231913 | 8/2004 |
| JP | 2005-249377 | 9/2005 |
| JP | 2005-264361 | 9/2005 |
| JP | 2005-289043 | 10/2005 |
| JP | 2006-022163 | 1/2006 |
| JP | 2006-096898 | 4/2006 |
| JP | 2008-081676 | 4/2008 |
| JP | 2008-127421 | 6/2008 |
| JP | 2008-522001 | 6/2008 |
| JP | 2008-239860 | 10/2008 |
| JP | 2009-120826 | 6/2009 |
| JP | 2009-249613 | 10/2009 |
| JP | 2009-263542 | 11/2009 |
| JP | 2009-265640 | 11/2009 |
| JP | 2010-532806 | 10/2010 |
| JP | 2011-111517 | 6/2011 |
| JP | 2011-195773 | 10/2011 |
| JP | 2012-033434 | 2/2012 |
| JP | 2012-167263 | 9/2012 |
| JP | 2012-188507 | 10/2012 |
| JP | 2012-201786 | 10/2012 |
| JP | 2013-018842 | 1/2013 |
| JP | 2013-203977 | 10/2013 |
| JP | 2015-192120 | 11/2015 |
| JP | 2017-122139 | 7/2017 |
| JP | 2017-128688 | 7/2017 |
| JP | 2018-111796 | 7/2018 |
| JP | 2018-153845 | 10/2018 |
| JP | 2018-172565 | 11/2018 |
| JP | 2020-059824 | 4/2020 |
| JP | 2020-076031 | 5/2020 |
| JP | 2021-098772 | 7/2021 |
| JP | 2021-113944 | 8/2021 |
| JP | 2022-055457 | 4/2022 |
| JP | 2023-062580 | 5/2023 |
| KR | 20190056448 | 5/2019 |
| TW | 202035580 | 10/2020 |
| WO | 99/055633 | 11/1999 |
| WO | 2011/048802 | 4/2011 |
| WO | 2012/026368 | 3/2012 |
| WO | 2016/051915 | 4/2016 |
| WO | 2018/005997 | 1/2018 |
| WO | 2019/193677 | 10/2019 |
| WO | 2019/220663 | 11/2019 |
| WO | 2019/235465 | 12/2019 |
| WO | 2020/095858 | 5/2020 |
| WO | 2020/149193 | 7/2020 |
| WO | 2021/044260 | 3/2021 |
| WO | 2021/107001 | 6/2021 |
| WO | 2021/107002 | 6/2021 |
| WO | 2022/181446 | 9/2022 |
| WO | 2022/181454 | 9/2022 |

OTHER PUBLICATIONS

International Preliminary Report on Patentability with Written Opinion dated Jun. 9, 2022 for PCT/JP2020/043978.

International Preliminary Report on Patentability with Written Opinion dated Jun. 9, 2022 for PCT/JP2020/043980.

International Preliminary Report on Patentability with Written Opinion dated Jun. 9, 2022 for PCT/JP2020/043999.

International Preliminary Report on Patentability with Written Opinion dated Jun. 9, 2022 for PCT/JP2020/044000.

Cai, Z. J. et al., "Crystallization behavior, thermal property and biodegradation of poly(3-hydroxybutyrate)/poly(ethylene glycol) grafting copolymer", Polymer Degradation and Stability, 2011, 96, p. 1602-p. 1609.

International Search Report dated Feb. 2, 2021 for PCT/JP2020/043978.

International Search Report dated Feb. 2, 2021 for PCT/JP2020/043980.

International Search Report dated Jan. 12, 2021 for PCT/JP2020/043999.

International Search Report dated Jan. 12, 2021 for PCT/JP2020/044000.

Extended Search Report in corresponding European Application No. 20892676.6, dated Dec. 19, 2022.

Shin-Nakamura Chemical Co., Ltd., "NK Ester List Products", 2026, p. 1-p. 10.

"Poly(ethylene glycol) diacrylate", Polysciences, 2025, p. 1.

"Polyethylene glycol monomethyl ether M.W. 4000", Avantor, 2025, p. 1.

International Search Report dated Apr. 19, 2022 for PCT/JP2022/006432.

International Search Report dated Sep. 21, 2021 for PCT/JP2021/026993.

International Search Report dated Aug. 1, 2023 for PCT/JP2023/017982.

International Search Report dated Nov. 1, 2022 for PCT/JP2022/032287.

International Search Report dated Jul. 25, 2023 for PCT/JP2023/017974.

International Preliminary Report on Patentability with Written Opinion dated Nov. 28, 2024 for PCT/JP2023/017982.

International Preliminary Report on Patentability with Written Opinion dated Mar. 14, 2024 for PCT/JP2022/032287.

International Preliminary Report on Patentability with Written Opinion dated Nov. 28, 2024 for PCT/JP2023/017974.

Extended Search Report in corresponding European Application No. 23807581.6, dated Jul. 18, 2025.

Soei Intellectual Property Law, Statement of Related Matters, dated Feb. 17, 2026.

* cited by examiner

CURABLE COMPOSITION SET AND ARTICLE

CROSS-REFERENCE TO RELATED APPLICATIONS

This application is a 35 U.S.C. § 371 national phase application of PCT/JP2020/043978, filed on Nov. 26, 2020, which claims priority to Japanese Patent Application No. 2019-216616, filed on Nov. 29, 2019, and to Japanese Patent Application No. 2020-019070, filed on Feb. 6, 2020.

TECHNICAL FIELD

The present invention relates to a curable composition set and an article.

BACKGROUND ART

Electronic components such as processors and power modules, batteries for electric vehicles, and the like are accompanied by heat generation during use. In order to protect such a component from heat, a means that efficiently dissipates the generated heat is required. A thermally conductive material (may also be referred to as thermal dissipation material) called a thermal interface material (TIM) is a material provided between a heat source and a thermal dissipation member such as a heat sink, and the thermally conductive material reduces the heat resistance between the heat source and the thermal dissipation member and promotes thermal conduction from the heat source. Since the heat generated from the heat source is efficiently conducted to a cooling member via the TIM, the heat is easily dissipated from the thermal dissipation member.

Regarding the thermally conductive material, a large number of liquid materials are known, and they are also referred to as thermal dissipation greases or thermally conductive greases. For example, in Patent Literature 1, a thermally conductive grease composition containing predetermined amounts of a liquid hydrocarbon oil and/or a fluorinated hydrocarbon oil and a thermally conductive inorganic filler is disclosed. Furthermore, in Patent Literature 2, a thermally conductive grease containing a specific phenyl ether-based base oil, a specific phenol-based oxidation inhibitor, and an inorganic powder filler is disclosed.

CITATION LIST

Patent Literature

Patent Literature 1: Japanese Unexamined Patent Publication No. 11-246885
Patent Literature 2: Japanese Unexamined Patent Publication No. 2011-111517

SUMMARY OF INVENTION

Technical Problem

When a liquid thermally conductive grease is used, liquid dripping or a pump-out phenomenon in which the grease is pushed out from between the members due to deformation of the member on which the thermally conductive grease is applied, may occur. Liquid dripping or the pump-out phenomenon generates voids between the grease and the member, decreases the adhesiveness of the grease to the member, and causes an increase in heat resistance between the thermal dissipation grease and the member. Due to liquid dripping or the pump-out phenomenon, other members may be contaminated by the grease, and insulation failure may occur.

In order to solve such a problem, a thermally conductive material formed into a solid form such as a sheet may be used. Liquid dripping or the pump-out phenomenon can be suppressed by using a solid-form thermally conductive material. On the other hand, in an electronic component containing a member that generates heat and a thermal dissipation member, deformation such as warpage of the members may occur when cooling and heating is repeated. Accordingly, the solid-form thermally conductive material is required to be a material having low elasticity and excellent elongation so that the material can follow deformation of the members.

According to an aspect, an object of the present invention is to provide a curable composition set capable of giving a cured product having low elasticity and excellent elongation.

Solution to Problem

The inventors of the present invention conducted a thorough study, and as a result, the inventors found that a cured product of a curable composition set containing a specific compound having a polyoxyalkylene chain and having two (meth)acryloyl groups has low elasticity and excellent elongation. Furthermore, the inventors found that since this curable composition set contains a thermally conductive filler, the curable composition set is suitably used as a thermally conductive material, thus the inventors completing the present invention. According to some aspects, the present invention provides the following [1] to [11].

[1] A curable composition set containing: a first liquid containing an oxidizing agent; and a second liquid containing a reducing agent, wherein at least one of the first liquid and the second liquid contains a compound represented by the following formula (1):

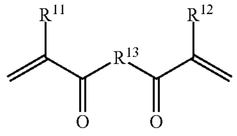

(1)

wherein $R^{11}$ and $R^{12}$ each independently represent a hydrogen atom or a methyl group, and $R^{13}$ represents a divalent group having a polyoxyalkylene chain, and wherein at least one of the first liquid and the second liquid contains a thermally conductive filler.

[2] The curable composition set according to [1], wherein the polyoxyalkylene chain contains a structural unit represented by the following formula (2):

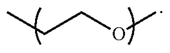

(2)

[3] The curable composition set according to [1], wherein the polyoxyalkylene chain contains a structural unit represented by the following formula (3):

(3)

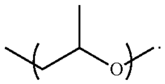

[4] The curable composition set according to [1], wherein the polyoxyalkylene chain is a copolymer chain containing a structural unit represented by the following formula (2) and a structural unit represented by the following formula (3):

(2)

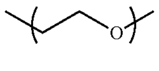

(3)

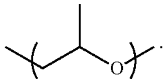

[5] The curable composition set according to [4], wherein the copolymer chain is a random copolymer chain.

[6] The curable composition set according to any one of [1] to [5], wherein the compound represented by the formula (1) has a weight average molecular weight of 5000 or more.

[7] The curable composition set according to any one of [1] to [6], wherein the polyoxyalkylene chain has 100 or more of oxyalkylene groups.

[8] The curable composition set according to any one of [1] to [7], wherein the compound represented by the formula (1) has a viscosity at 25° C. of 1000 Pa·s or less.

[9] The curable composition set according to any one of [1] to [8], further containing an oxidation inhibitor.

[10] The curable composition set according to [9], wherein the oxidation inhibitor is a phenol-based oxidation inhibitor.

[11] An article containing a heat source and a cured product of the curable composition set according to any one of [1] to [10], the cured product being provided to be thermally in contact with the heat source.

Advantageous Effects of Invention

According to an aspect of the present invention, a curable composition set capable of giving a cured product having low elasticity and excellent elongation can be provided. According to another aspect of the present invention, a curable composition set capable of giving a cured product having excellent elongation as well as low elasticity can be provided.

DESCRIPTION OF EMBODIMENTS

Figure 1:
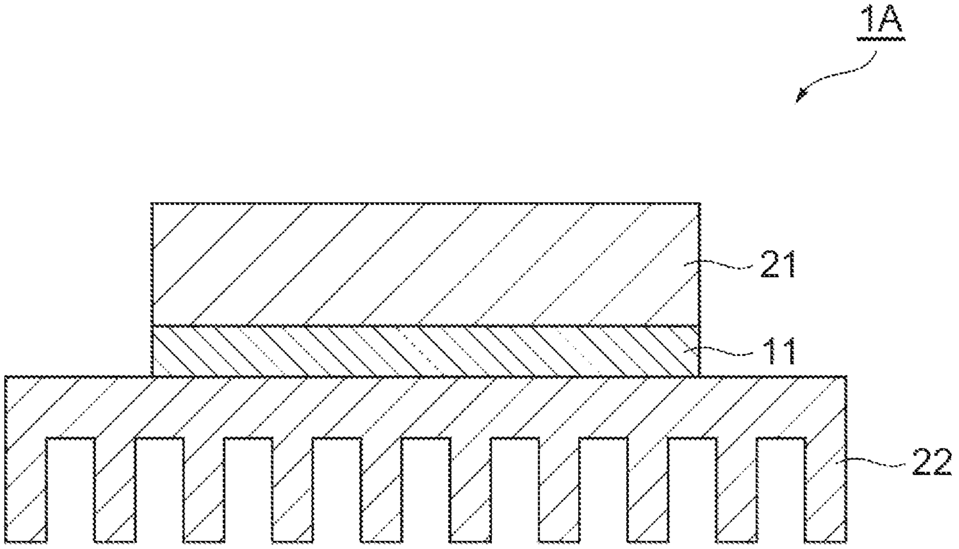
FIG. 1 is a schematic cross-sectional view illustrating an embodiment of an article containing a cured product of a curable composition set.

Hereinafter, embodiments of the present invention will be described in detail with appropriate reference to the drawings. Incidentally, the present invention is not intended to be limited to the following embodiments.

The term "(meth)acryloyl" according to the present specification means "acryloyl" and "methacryloyl" corresponding thereto, and the same also applies to similar expressions such as "(meth)acrylate" and "(meth)acryl".

The weight average molecular weight (Mw) according to the present specification means a value measured using gel permeation chromatography (GPC) under the following conditions and determined by using polystyrene as a standard substance.

Measuring equipment: HLC-8320GPC (product name, manufactured by Tosoh Corp.)

Analysis column: TSKgel SuperMultipore HZ-H (three columns connected) (product name, manufactured by Tosoh Corp.)

Guide column: TSKguardcolumn SuperMP (HZ)-H (product name, manufactured by Tosoh Corp.)

Eluent: THF

Measurement temperature: 25° C.

[0015] [Curable composition set]A curable composition set according to an embodiment contains: a first liquid containing an oxidizing agent; and a second liquid containing a reducing agent. By mixing the first liquid and the second liquid, the oxidizing agent and the reducing agent react with each other to generate free radicals, and polymerization of a polymerizable component such as a compound represented by the formula (1) described below proceeds. According to the curable composition set of the present embodiment, a cured product of a mixture of the first liquid and the second liquid (hereinafter, this cured product is also referred to as a "cured product of the curable composition set") is obtained by mixing the first liquid and the second liquid.

The oxidizing agent contained in the first liquid plays the role as a polymerization initiator (radical polymerization initiator). The oxidizing agent may be, for example, an organic peroxide or an azo compound. The organic peroxide may be, for example, a hydroperoxide, a peroxydicarbonate, a peroxy ester, a peroxy ketal, a dialkyl peroxide, or a diacyl peroxide. The azo compound may be AIBN (2,2'-azobisisobutyronitrile), γ-65 (azobisdimethylvaleronitrile), or the like. Regarding the oxidizing agent, one kind thereof can be used alone, or two or more kinds thereof can be used in combination.

Examples of the hydroperoxide include diisopropylbenzene hydroperoxide, 1,1,3,3-tetramethylbutyl hydroperoxide, and cumene hydroperoxide.

Examples of the peroxydicarbonate include di-n-propyl peroxydicarbonate, diisopropyl peroxydicarbonate, bis(4-t-butylcyclohexyl) peroxydicarbonate, di-2-ethoxymethoxy peroxydicarbonate, di(2-ethylhexylperoxy) dicarbonate, dimethoxybutyl peroxydicarbonate, and di(3-methyl-3-methoxybutyl peroxy) dicarbonate.

Examples of the peroxy ester include cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxypivalate, 1,1,3,3-tetramethylbutyl peroxy-2-ethylhexanoate, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, t-butyl peroxyisobutyrate, 1,1-bis(t-butylperoxy)cyclohexane, t-butyl peroxy-3,5,5-trimethylhexanoate, t-butyl peroxylaurate, 2,5-dimethyl-2,5-di(m-toluoylperoxy)hexane, t-hexyl peroxybenzoate, and t-butyl peroxyacetate.

Examples of the peroxy ketal include 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclododecane, and 2,2-bis(t-butylperoxy)decane.

Examples of the dialkyl peroxide include α,α'-bis(t-butylperoxy)diisopropylbenzene, dicumyl peroxide, 2,5-dimethyl-2,5-di(t-butylperoxy)hexane, and t-butyl cumyl peroxide.

Examples of the diacyl peroxide include isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxytoluene, and benzoyl peroxide.

From the viewpoint of storage stability, the oxidizing agent is preferably a peroxide, more preferably a hydroperoxide, even more preferably 1,1,3,3-tetramethylbutyl hydroperoxide or cumene hydroperoxide, and particularly preferably 1,1,3,3-tetramethylbutyl hydroperoxide.

The content of the oxidizing agent may be 0.1% by mass or more, 0.5% by mass or more, or 1% by mass or more, and may be 10% by mass or less, 5% by mass or less, or 3% by mass or less, based on the sum of the first liquid and the second liquid.

The reducing agent contained in the second liquid may be, for example, a tertiary amine, a thiourea derivative, or a transition metal salt. Examples of the tertiary amine include triethylamine, tripropylamine, tributylamine, and N,N-dimethyl-parα-toluidine. Examples of the thiourea derivative include 2-mercaptobenzimidazole, methylthiourea, dibutylthiourea, tetramethylthiourea, and ethylenethiourea. Examples of the transition metal salt include cobalt naphthenate, copper naphthenate, and vanadyl acetylacetonate.

From the viewpoint of having an excellent curing rate, the reducing agent is preferably a thiourea derivative or a transition metal salt. The thiourea derivative may be, for example, ethylenethiourea. From a similar viewpoint, the transition metal salt is preferably vanadyl acetylacetonate.

The content of the reducing agent may be 0.05% by mass or more, 0.1% by mass or more, or 0.3% by mass or more, and may be 5% by mass or less, 3% by mass or less, or 1% by mass or less, based on the sum of the first liquid and the second liquid.

In the curable composition set, at least one of the first liquid and the second liquid contains a compound represented by the following formula (1):

(1)

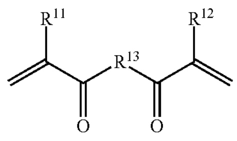

wherein $R^{11}$ and $R^{12}$ each independently represent a hydrogen atom or a methyl group, and $R^{13}$ represents a divalent group having a polyoxyalkylene chain.

According to an embodiment, any one of $R^{11}$ and $R^{12}$ may be a hydrogen atom, while the other may be a methyl group; according to another embodiment, both $R^{11}$ and $R^{12}$ may be a hydrogen atom; and according to still another embodiment, both $R^{11}$ and $R^{12}$ may be a methyl group.

According to an embodiment, the polyoxyalkylene chain contains a structural unit represented by the following formula (2).

(2)

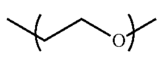

As a result, the strength of the cured product can be increased while suppressing an excessive increase of the viscosity of the curable composition (which refers to one or both of the first liquid and the second liquid; the same applies hereinafter).

In this case, $R^3$ may be a divalent group having a polyoxyethylene chain, and the compound represented by the formula (1) is preferably a compound represented by the following formula (1-2) (polyethylene glycol di(meth)acrylate):

(1-2)

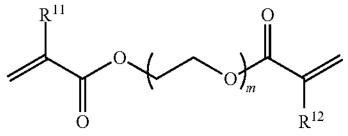

wherein $R^{11}$ and $R^{12}$ have the same meanings as $R^{11}$ and $R^{12}$ in the formula (1), respectively; and m represents an integer of 2 or more.

According to another embodiment, the polyoxyalkylene chain contains a structural unit represented by the following formula (3).

(3)

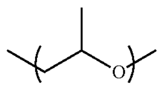

As a result, handling of the curable composition can be facilitated.

In this case, $R^{13}$ may be a divalent group having a polyoxypropylene chain, and the compound represented by the formula (1) is preferably a compound represented by the following formula (1-3) (polypropylene glycol di(meth) acrylate):

(1-3)

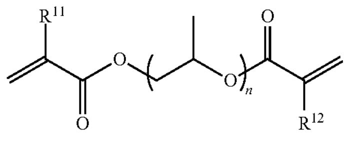

wherein $R^{11}$ and $R^{12}$ have the same meanings as $R^{11}$ and $R^{12}$ in the formula (1), respectively, and n represents an integer of 2 or more.

According to another embodiment, from the viewpoint of making it easy to achieve both the strength of a cured product of the compound represented by the formula (1) and the handleability of the curable composition, the polyoxyalkylene chain is preferably a copolymer chain containing the above-mentioned structural unit represented by the formula (2) and the above-mentioned structural unit represented by the formula (3). The copolymer chain may be any one of an alternating copolymer chain, a block copolymer chain, or a random copolymer chain. From the viewpoint of further lowering the crystallinity of the compound represented by the formula (1) and further facilitating the handling of the curable composition, the copolymer chain is preferably a random copolymer chain.

In each of the above-mentioned embodiments, the polyoxyalkylene chain may have an oxyalkylene group having 4 or 5 carbon atoms, such as an oxytetramethylene group, an oxybutylene group, or an oxypentylene group, as a structural unit in addition to the structural unit represented by the formula (2) and the structural unit represented by the formula (3).

$R^{13}$ may also be a divalent group further having an additional organic group in addition to the above-mentioned polyoxyalkylene chain.

The additional organic group may be a chain-like group other than the polyoxyalkylene chain, and the additional organic group may be, for example, a methylene chain (chain having —$CH_2$— as a structural unit), a polyester chain (chain containing —COO— in a structural unit), or a polyurethane chain (chain containing —OCON— in a structural unit).

For example, the compound represented by the formula (1) may be a compound represented by the following formula (1-4):

(1-4)

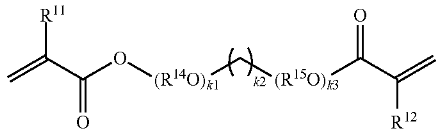

wherein $R^{11}$ and $R^{12}$ have the same meanings as $R^{11}$ and $R^{12}$ in the formula (1), respectively; $R^{14}$ and $R^{15}$ each independently represent an alkylene group having 2 to 5 carbon atoms; and k1, k2, and k3 each independently represent an integer of 2 or more. k2 may be, for example, an integer of 16 or less.

Each of $R^{14}$ and $R^{15}$, which are present in plurality, may be identical with each other or may be different from each other. Each of $R^{14}$ and $R^{15}$, which are present in plurality, preferably contains an ethylene group and a propylene group. That is, a polyoxyalkylene chain represented by $(R^{14}0)_{k1}$ and a polyoxyalkylene chain represented by $(R^{15}O)_{k3}$ are each preferably a copolymer chain containing an oxyethylene group (the above-described structural unit represented by the formula (2)) and an oxypropylene group (the above-described structural unit represented by the formula (3)).

In each of the above-described embodiments, the polyoxyalkylene chain preferably has 100 or more of oxyalkylene groups. When the number of oxyalkylene groups in the polyoxyalkylene chain is 100 or more, as the main chain of the compound represented by the formula (1) becomes longer, the elongation of the cured product is superior, and the strength of the cured product can also be increased. The number of oxyalkylene groups corresponds to each of m in the formula (1-2), n in the formula (1-3), and k1 and k3 in the formula (1-4).

The number of oxyalkylene groups in the polyoxyalkylene chain is more preferably 130 or more, 180 or more, 200 or more, 220 or more, 250 or more, 270 or more, 300 or more, or 320 or more. The number of oxyalkylene groups in the polyoxyalkylene chain may be 600 or less, 570 or less, or 530 or less.

From the viewpoint that the cured product has lower elasticity and excellent elongation, the weight average molecular weight of the compound represented by the formula (1) is preferably 5000 or more, 6000 or more, 7000 or more, 8000 or more, 9000 or more, 10000 or more, 11000 or more, 12000 or more, 13000 or more, 14000 or more, or 15000 or more. From the viewpoint of facilitating the adjustment of the viscosity of the curable composition, the weight average molecular weight of the compound represented by the formula (1) is preferably 100000 or less, 80000 or less, 60000 or less, 34000 or less, 31000 or less, or 28000 or less.

The compound represented by the formula (1) may be liquid at 25° C. In this case, from the viewpoint of facilitating the application on a surface to be coated and from the viewpoint of increasing the adhesiveness of the cured product to a surface to be coated, the viscosity at 25° C. of the compound represented by the formula (1) is preferably 1000 Pa·s or less, 800 Pa·s or less, 600 Pa·s or less, 500 Pa·s or less, 350 Pa·s or less, 300 Pa·s or less, or 200 Pa·s or less. The viscosity at 25° C. of the compound represented by the formula (1) may be 0.1 Pa·s or more, 0.2 Pa·s or more, 0.3 Pa·s or more, 1 Pa·s or more, 2 Pa·s or more, or 3 Pa·s or more.

The compound represented by the formula (1) may be solid at 25° C. In this case, from the viewpoint of further enhancing the handleability of the curable composition, the compound represented by the formula (1) is preferably liquid at 50° C. Furthermore, in this case, from the viewpoint of further enhancing the handleability of the curable composition, the viscosity at 50° C. of the compound represented by the formula (1) is preferably 100 Pa·s or less, more preferably 50 Pa·s or less, even more preferably 30 Pa·s or less, and particularly preferably 20 Pa·s or less. The viscosity at 50° C. of the compound represented by the formula (1) may be 0.1 Pa·s or more, 0.2 Pa·s or more, or 0.3 Pa·s or more.

The viscosity means a value measured based on JIS Z 8803, and specifically, the viscosity means a value measured by using an E type viscometer (for example, manufactured by Toki Sangyo Co., Ltd., PE-80L). Incidentally, compensation of the viscometer can be carried out based on JIS Z 8809-JS14000. The viscosity of the compound represented by the formula (1) can be adjusted by adjusting the weight average molecular weight of the compound.

From the viewpoint that the cured product has lower elasticity and excellent elongation, the content of the compound represented by the formula (1) is preferably 1% by mass or more, more preferably 1.5% by mass or more, and even more preferably 2% by mass or more, based on the sum of the first liquid and the second liquid. The content of the compound represented by the formula (1) may be 20% by mass or less, 17% by mass or less, or 15% by mass or less, based on the sum of the first liquid and the second liquid.

The curable composition may contain an additional polymerizable compound (the details will be described below) other than the compound represented by the formula (1). In this case, from the viewpoint that the cured product has lower elasticity and excellent elongation, the content of the compound represented by the formula (1) is preferably 10 parts by mass or more, 20 parts by mass or more, 25 parts by mass or more, 30 parts by mass or more, or 35 parts by mass or more, with respect to 100 parts by mass of the sum of the compound represented by the formula (1) and the additional polymerizable compound (hereinafter, referred to as "sum of the contents of the polymerizable components"). The content of the compound represented by the formula (1) may be 80 parts by mass or less, 60 parts by mass or less, or 50 parts by mass or less, with respect to 100 parts by mass of the sum of the contents of the polymerizable components.

In the curable composition set, at least one of the first liquid and the second liquid contains a thermally conductive filler. As a result, the thermal conductivity of the curable composition set and a cured product thereof is enhanced, and therefore, the curable composition set can be suitably utilized as a thermally conductive material, a thermal dissipation material, or the like. The thermally conductive filler refers to a filler having a thermal conductivity of 10 W/m-K or higher. Both of the first liquid and the second liquid preferably contain a thermally conductive filler.

The thermally conductive filler may be insulative or may be electrically conductive, and the thermally conductive filler is preferably an insulative filler. Examples of the material that constitutes an insulative thermally conductive filler include aluminum oxide, aluminum hydroxide, magnesium oxide, beryllium oxide, boron nitride, aluminum nitride, silicon nitride, silicon carbide, silicon dioxide, aluminum fluoride, calcium fluoride, and zinc oxide. Examples of the material that constitutes an electrically conductive thermally conductive filler include aluminum, silver, and copper. The shape of the thermally conductive filler may be spherical or may be polyhedral.

From the viewpoint that a cured product of the curable composition set can be thinly disposed, the average particle size of the thermally conductive filler is preferably 50 μm or less, more preferably 40 μm or less, even more preferably 30 μm or less, and may be 0.05 μm or more, 0.1 μm or more, or 0.3 μm or more. The average particle size of the thermally conductive filler means the particle size (D50) at which the volume cumulative particle size distribution is 50%, and the average particle size is measured using a laser diffraction type particle size distribution analyzer (for example, SALD-2300 (manufactured by SHIMADZU CORPORATION)).

From the viewpoint of increasing the thermal conductivity of the curable composition, the content of the thermally conductive filler is preferably 60% by mass or more, more preferably 70% by mass or more, and even more preferably 80% by mass or more, and may be 97% by mass or less, 95% by mass or less, or 93% by mass or less, based on the sum of the first liquid and the second liquid.

From the viewpoint of increasing the thermal conductivity of the curable composition, the content of the thermally conductive filler is preferably 70% by volume or more, more preferably 75% by volume or more, and even more preferably 80% by volume or more, and may be 90% by volume or less, 88% by volume or less, or 85% by volume or less, based on the total volume of the curable composition.

For the purpose of adjusting the physical properties of the curable composition and the like, the curable composition may further contain an additional polymerizable compound that can be copolymerized with the above-mentioned compound represented by the formula (1).

The additional polymerizable compound may be, for example, a compound having one (meth)acryloyl group. This compound may be, for example, an alkyl (meth)acrylate. The additional polymerizable compound may also be a compound having an aromatic hydrocarbon group, a group containing a polyoxyalkylene chain, a group containing a heterocyclic ring, an alkoxy group, a phenoxy group, a group containing a silane group, a group containing a siloxane bond, a halogen atom, a hydroxyl group, a carboxyl group, an amino group, or an epoxy group, in addition to the one (meth)acryloyl group. Particularly, as the curable composition contains an alkyl (meth)acrylate, the viscosity of the curable composition can be adjusted. Furthermore, as the curable composition contains a compound having a hydroxyl group, a carboxyl group, an amino group, or an epoxy group in addition to the (meth)acryloyl group, the adhesiveness of the curable composition and a cured product thereof to a member can be further enhanced.

The alkyl group in the alkyl (meth)acrylate (alkyl group moiety other than the (meth)acryloyl group) may be linear, branched, or alicyclic. The number of carbon atoms of the alkyl group may be, for example, 1 to 30. The number of carbon atoms of the alkyl group may be 1 to 11, 1 to 8, 1 to 6, or 1 to 4, and may be 12 to 30, 12 to 28, 12 to 24, 12 to 22, 12 to 18, or 12 to 14.

Examples of the alkyl (meth)acrylate having a linear alkyl group include an alkyl (meth)acrylate having a linear alkyl group having 1 to 11 carbon atoms, such as methyl (meth)acrylate, ethyl (meth)acrylate, propyl (meth)acrylate, butyl (meth)acrylate, pentyl (meth)acrylate, n-hexyl (meth)acrylate, n-heptyl (meth)acrylate, octyl (meth)acrylate, nonyl (meth)acrylate, decyl (meth)acrylate, or undecyl (meth)acrylate; and an alkyl (meth)acrylate having a linear alkyl group having 12 to 30 carbon atoms, such as dodecyl (meth)acrylate (lauryl (meth)acrylate), tetradecyl (meth)acrylate, hexadecyl (meth)acrylate (cetyl (meth)acrylate), octadecyl (meth)acrylate (stearyl (meth)acrylate), docosyl (meth)acrylate (behenyl (meth)acrylate), tetracosyl (meth)acrylate, hexacosyl (meth)acrylate, or octacosyl (meth)acrylate.

Examples of the alkyl (meth)acrylate having a branched alkyl group include an alkyl (meth)acrylate having a branched alkyl group having 1 to 11 carbon atoms, such as s-butyl (meth)acrylate, t-butyl (meth)acrylate, isobutyl (meth)acrylate, isopentyl (meth)acrylate, isoamyl (meth)acrylate, isooctyl (meth)acrylate, 2-ethylhexyl (meth)acrylate, isononyl (meth)acrylate, or isodecyl (meth)acrylate; and an alkyl (meth)acrylate having a branched alkyl group having 12 to 30 carbon atoms, such as isomyristyl (meth)acrylate, 2-propylheptyl (meth)acrylate, isoundecyl (meth)acrylate, isododecyl (meth)acrylate, isotridecyl (meth)acrylate, isopentadecyl (meth)acrylate isohexadecyl (meth)acrylate, isoheptadecyl (meth)acrylate, isostearyl (meth)acrylate, or decyltetradecanyl (meth)acrylate.

Examples of the alkyl (meth)acrylate having an alicyclic alkyl group (cycloalkyl group) include cyclohexyl (meth)acrylate, 3,3,5-trimethylcyclohexyl (meth)acrylate, isobornyl (meth)acrylate, terpene (meth)acrylate, and dicyclopentanyl (meth)acrylate.

The compound having a (meth)acryloyl group and an aromatic hydrocarbon group may be benzyl (meth)acrylate or the like.

Examples of the compound having a group containing a (meth)acryloyl group and a group containing a polyoxyalkylene chain include polyethylene glycol (meth)acrylate, methoxy polyethylene glycol (meth)acrylate, polypropylene glycol (meth)acrylate, methoxy polypropylene glycol (meth)acrylate, polybutylene glycol (meth)acrylate, and methoxy polybutylene glycol (meth)acrylate.

Examples of the compound having a (meth)acryloyl group and a group containing a heterocyclic ring include tetrahydrofurfuryl (meth)acrylate.

Examples of the compound having a (meth)acryloyl group and an alkoxy group include 2-methoxyethyl acrylate.

Examples of the compound having a (meth)acryloyl group and a phenoxy group include phenoxyethyl (meth) acrylate.

Examples of the compound having a (meth)acryloyl group and a group containing a silane group include 3-acryloxypropyltriethoxysilane,
10-methacryloyloxydecyltrimethoxysilane,
10-acryloyloxydecyltrimethoxysilane,
10-methacryloyloxydecyltriethoxysilane, and
10-acryloyloxydecyltriethoxysilane.

Examples of the compound having a (meth)acryloyl group and a group containing a siloxane bond include silicone (meth)acrylate.

Examples of the compound having a (meth)acryloyl group and a halogen atom include (meth)acrylates having fluorine atoms, such as trifluoromethyl (meth)acrylate, 2,2,2-trifluoroethyl (meth)acrylate, 1,1,1,3,3,3-hexafluoro-2-propyl (meth)acrylate, perfluoroethylmethyl (meth)acrylate, perfluoropropylmethyl (meth)acrylate, perfluorobutylmethyl (meth)acrylate, perfluoropentylmethyl (meth)acrylate, perfluorohexylmethyl (meth)acrylate, perfluoroheptylmethyl (meth)acrylate, perfluorooctylmethyl (meth)acrylate, perfluorononylmethyl (meth)acrylate, perfluorodecylmethyl (meth)acrylate, perfluoroundecylmethyl (meth)acrylate, perfluorododecylmethyl (meth)acrylate, perfluorotridecylmethyl (meth)acrylate, perfluorotetradecylmethyl (meth)acrylate, 2-(trifluoromethyl)ethyl (meth)acrylate, 2-(perfluoroethyl)ethyl (meth)acrylate, 2-(perfluoropropyl) ethyl (meth)acrylate, 2-(perfluorobutyl)ethyl (meth)acrylate, 2-(perfluoropentyl)ethyl (meth)acrylate, 2-(perfluorohexyl) ethyl (meth)acrylate, 2-(perfluoroheptyl)ethyl (meth)acrylate, 2-(perfluorooctyl)ethyl (meth)acrylate, 2-(perfluorononyl)ethyl (meth)acrylate, 2-(perfluorotridecyl)ethyl (meth)acrylate, and 2-(perfluorotetradecyl)ethyl (meth)acrylate.

Examples of the compound having a (meth)acryloyl group and a hydroxyl group include a hydroxyalkyl (meth) acrylate such as 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 6-hydroxyhexyl (meth)acrylate, 8-hydroxyoctyl (meth) acrylate, 10-hydroxydecyl (meth)acrylate, or 12-hydroxylauryl (meth)acrylate; and a hydroxyalkylcycloalkane (meth)acrylate such as (4-hydroxymethylcyclohexyl)methyl (meth)acrylate.

Examples of the compound having a (meth)acryloyl group and a carboxyl group include (meth)acrylic acid, carboxyethyl (meth)acrylate, carboxypentyl (meth)acrylate, phthalic acid monohydroxyethyl acrylate (for example, "ARONIX M5400" manufactured by Toagosei Co., Ltd.), and 2-acryloyloxyethyl succinate (for example, "NK ESTER A-SA" manufactured by Shin-Nakamura Chemical Co., Ltd.).

Examples of the compound having a (meth)acryloyl group and an amino group include N,N-dimethylaminoethyl (meth)acrylate, N,N-diethylaminoethyl (meth)acrylate, N,N-dimethylaminopropyl (meth)acrylate, and N,N-diethylaminopropyl (meth)acrylate.

Examples of the compound having a (meth)acryloyl group and an epoxy group include glycidyl (meth)acrylate, glycidyl α-ethyl (meth)acrylate, glycidyl α-n-propyl (meth) acrylate, glycidyl α-n-butyl (meth)acrylate, 3,4-epoxybutyl (meth)acrylate, 4,5-epoxypentyl (meth)acrylate, 6,7-epoxyheptyl (meth)acrylate, 6,7-epoxyheptyl α-ethyl (meth)acrylate, 3-methyl-3,4-epoxybutyl (meth)acrylate, 4-methyl-4,5-epoxypentyl (meth)acrylate, 5-methyl-5,6-epoxyhexyl (meth)acrylate, f3-methylglycidyl (meth)acrylate, and β-methylglycidyl α-ethyl (meth)acrylate.

From the viewpoint of facilitating the adjustment of the viscosity of the curable composition and from the viewpoint of further increasing the adhesiveness of the curable composition, the content of the additional polymerizable compound is preferably 1% by mass or more, more preferably 3% by mass or more, and even more preferably 5% by mass or more, and may be 20% by mass or less, 15% by mass or less, or 10% by mass or less, based on the sum of the first liquid and the second liquid.

From the viewpoint of facilitating the adjustment of the viscosity of the curable composition, or from the viewpoint of further increasing the adhesiveness of the curable composition, the content of the additional polymerizable compound is preferably 30 parts by mass or more, more preferably 40 parts by mass or more, and even more preferably 50 parts by mass or more, and may be 90 parts by mass or less, 80 parts by mass or less, or 70 parts by mass or less, based on 100 parts by mass of the sum of the contents of the polymerizable components.

The curable composition can further contain a plasticizer. As the curable composition contains a plasticizer, the adhesiveness of the curable composition and the elongation of the cured product can be further enhanced. Examples of the plasticizer include tackifiers such as a butadiene rubber, an isoprene rubber, a silicone rubber, a styrene-butadiene rubber, a chloroprene rubber, a nitrile rubber, a butyl rubber, an ethylene-propylene rubber, a urethane rubber, an acrylic resin, a rosin-based resin, and a terpene-based resin; and a polyalkylene glycol.

The content of the plasticizer may be 0.1 parts by mass or more, 1 part by mass or more, or 3 parts by mass or more, and may be 20 parts by mass or less, 15 parts by mass or less, 12 parts by mass or less, or 10 parts by mass or less, with respect to 100 parts by mass of the sum of the contents of the polymerizable components.

From the viewpoint of enhancing the thermal reliability of a cured product of the curable composition set, the curable composition may further contain an oxidation inhibitor. The oxidation inhibitor may be, for example, a phenol-based oxidation inhibitor, a benzophenone-based oxidation inhibitor, a benzoate-based oxidation inhibitor, a hindered amine-based oxidation inhibitor, or a benzotriazole-based oxidation inhibitor, and the oxidation inhibitor is preferably a phenol-based oxidation inhibitor.

The phenol-based oxidation inhibitor has, for example, a hindered phenol structure (hindered phenol ring). The hindered phenol structure (hindered phenol ring) may be, for example, a structure in which a t-butyl group is bonded to any one position or both positions of the ortho-position with respect to the hydroxyl group in a phenol ring. The phenol-based oxidation inhibitor has one or more, preferably two or more, more preferably three or more, and even more preferably four or more of such a hindered phenol ring.

The content of the oxidation inhibitor may be 0.1% by mass or more, 0.2% by mass or more, or 0.3% by mass or more, and may be 5% by mass or less, 4% by mass or less, 3% by mass or less, 2% by mass or less, or 1% by mass or less, based on the sum of the first liquid and the second liquid.

The curable composition can further contain additional additives as necessary. Examples of the additional additives include a surface treatment agent (for example, a silane coupling agent), a dispersant, a curing accelerator, a colorant, a crystal nucleating agent, a thermal stabilizer, a foaming agent, a flame retardant, a vibration damping agent, a dehydrating agent, and a flame retardant aid (for example, a metal oxide). The content of the additional additives may be 0.1% by mass or more and may be 30% by mass or less, based on the sum of the first liquid and the second liquid.

The first liquid and the second liquid may be liquid at 25° C. As a result, it is possible to suitably coat the surface of an object such as a member serving as a heat source, a cooling member, or the like, and it is also possible to increase adhesion to the coated surface.

In the curable composition set, each component other than the oxidizing agent and the reducing agent is preferably contained in both the first liquid and the second liquid. That is, in one embodiment, it is preferable that the first liquid contains the oxidizing agent, the compound represented by the formula (1), and the thermally conductive filler (and the additional components used as necessary), and the second liquid contains the reducing agent, the compound represented by the formula (1), and the thermally conductive filler (and the additional components used as necessary).

Cured Product and Thermally Conductive Material

Since a cured product of the above-mentioned curable composition set has thermal conductivity, low elasticity, and excellent elongation, the cured product is suitably used as a thermally conductive material (also referred to as thermal dissipation material) in electronic components such as power modules, CPUs, and ECUs; batteries, LED lightings, and LED backlights. That is, an embodiment of the present invention provides a thermally conductive material containing the above-mentioned compound represented by the formula (1) and a thermally conductive filler.

Article

Subsequently, an article containing a cured product of the above-mentioned curable composition set will be described by taking an electronic component as an example. FIG. 1 is a schematic cross-sectional view illustrating an embodiment of an electronic component containing a cured product of the curable composition set. The electronic component 1A shown in FIG. 1 contains a semiconductor chip 21 as a heat source and a heat sink 22 as a thermal dissipation part.

The electronic component 1A contains a cured product 11 of the above-mentioned curable composition set, the cured product being provided between the semiconductor chip 21 and the heat sink 22. Since the cured product 11 has thermal conductivity, the cured product 11 works as a thermally conductive material (thermal interface material) in the electronic component 1A, and heat is conducted from the semiconductor chip 21 to the heat sink 22. Then, heat is dissipated from the heat sink 22 to the outside.

The cured product 11 has low elasticity and excellent elongation by using the above-mentioned curable composition set. Therefore, the cured product 11 has high followability to the deformation of the electronic component 1A occurring due to heat or the like. Accordingly, the heat generated from the semiconductor chip 21 can be effectively conducted to the heat sink 22. Furthermore, since the cured product 11 is a cured product of the above-mentioned curable composition set, the cured product 11 also has excellent strength (for example, breaking strength).

The cured product 11 can also be obtained by disposing the first liquid and the second liquid between the semiconductor chip 21 and the heat sink 22. Therefore, the generation of voids by liquid dripping and the pump-out phenomenon can be suppressed, and consequently, the adhesiveness of the cured product 11 (adhesiveness to the surface of the semiconductor chip 21 and the heat sink 22) can be made excellent.

In the electronic component 1A described in FIG. 1, the cured product 11 is disposed to be in direct contact with the semiconductor chip 21 and the heat sink 22; however, the cured product 11 may be thermally in contact with a heat source, or according to another embodiment, the cured product 11 may be disposed to be in contact with a heat source (semiconductor chip), with another member interposed therebetween.

Figure 2:
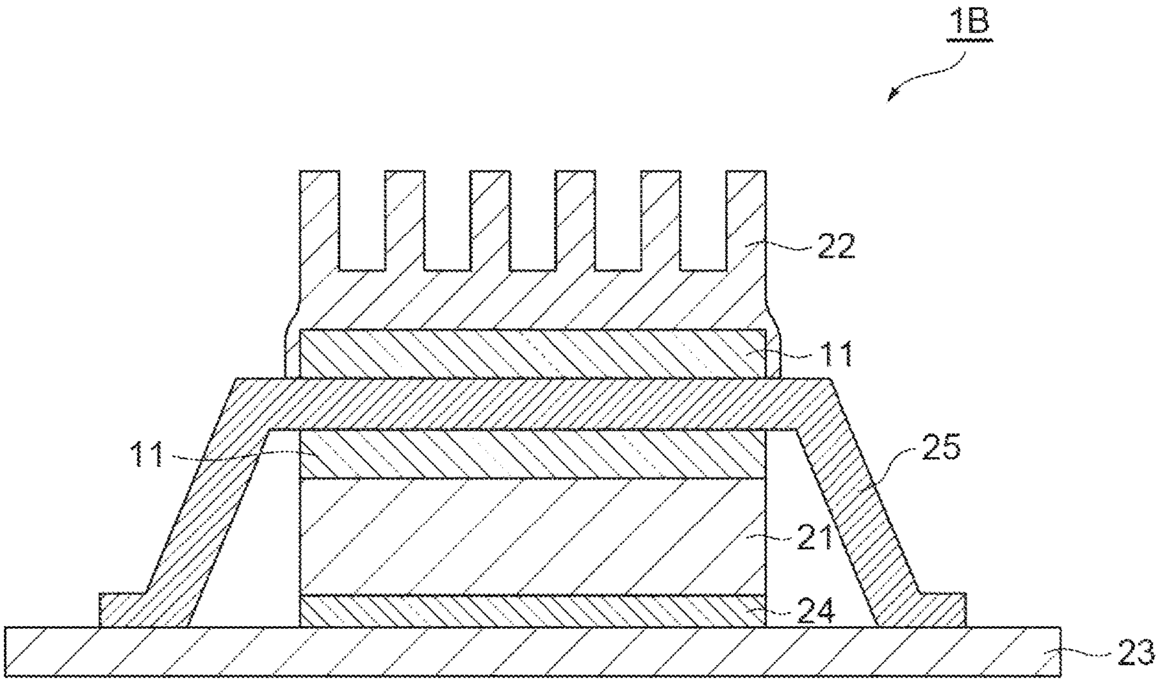
FIG. 2 is a schematic cross-sectional view illustrating another embodiment of an article containing a cured product of a curable composition set.

FIG. 2 is a schematic cross-sectional view illustrating another embodiment of an electronic component containing a cured product of the curable composition set. The electronic component 1B shown in FIG. 1 is a processor containing, on one surface of a substrate 23, a semiconductor chip 21 as a heat source disposed with an underfill 24 interposed therebetween, a heat sink 22 as a thermal dissipation part, and a heat spreader 25 provided between the semiconductor chip 21 and the heat sink 22. Provided between the semiconductor chip 21 and the heat spreader 25 is a first cured product 11 provided to be in contact with the semiconductor chip 21. Provided between the heat spreader 25 and the heat sink 22 is a second cured product 11.

The substrate 23, the underfill 24, and the heat spreader 25 may be formed from materials that are generally used in the art. For example, the substrate 23 may be a laminated substrate or the like, the underfill 24 may be formed from a resin such as an epoxy resin or the like, and the heat spreader 25 may be a metal plate or the like.

The first cured product 11 and the second cured product 11 are each a cured product of the above-mentioned curable composition set. The first cured product 11 is in direct contact with the semiconductor chip 21 as a heat source; however, the second cured product 11 is thermally in contact with the semiconductor chip 21 as a heat source, with the first cured product 11 and the heat spreader 25 interposed therebetween.

Since the first cured product 11 and the second cured product 11 have thermal conductivity, the cured products work as thermally conductive materials (thermal interface materials) for the electronic component 1B. That is, the first cured product 11 promotes thermal conduction from the semiconductor chip 21 to the heat spreader 25. Furthermore, the second cured product 11 promotes thermal conduction from the heat spreader 25 to the heat sink 22. Then, heat is dissipated from the heat sink 22 to the outside.

The first cured product 11 and the second cured product 11 have low elasticity and excellent elongation by using the above-mentioned curable composition set. Therefore, the first cured product 11 and the second cured product 11 have high followability to the deformation of the electronic component 1B occurring due to heat. Therefore, the heat generated from the semiconductor chip 21 can be more effectively conducted to the heat spreader 25, and in addition, the heat can be more effectively conducted to the heat sink 22. Furthermore, since the first cured product 11 and the second cured product 11 are cured products of the above-mentioned curable composition set, the cured products also have excellent strength (for example, breaking strength).

The first cured product 11 and the second cured product 11 can also be obtained by disposing the first liquid and the second liquid between the semiconductor chip 21 and the heat spreader 25, or between the heat spreader 25 and the heat sink 22. Therefore, even in the electronic component 1B, the generation of voids caused by liquid dripping and the pump-out phenomenon of the curable composition can be suppressed, and consequently, excellent adhesiveness of the first cured product 11 and the second cured product 11 (adhesiveness to the surface of the semiconductor chip 21, the heat spreader 25, and/or the heat sink 22) can be obtained.

EXAMPLES

Hereinafter, the present invention will be more specifically described by way of Examples; however, the present invention is not intended to be limited to the following Examples.

In the Examples, the following components were used as common components of the first liquid and the second liquid.

(A-1) A compound represented by the formula (1-7):

(1-7)

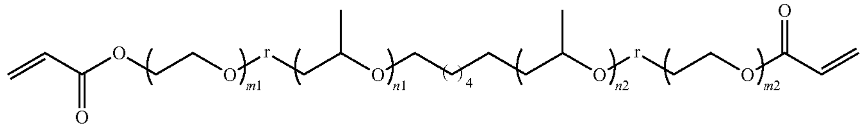

wherein -r- is a reference symbol representing random copolymerization, which was synthesized by the procedure shown below (weight average molecular weight: 15000, mixture in which m1+m2 in the formula (1-7) is approximately 252±5 and n1+n2 is approximately an integer of 63±5 (provided that m1, m2, n1, and n2 each independently represent an integer of 2 or more, m1+n1 z 100, m2+n2; 100), viscosity at 25° C.: 50 Pa·s)

(A-2) A compound represented by the formula (1-8):

(1-8)

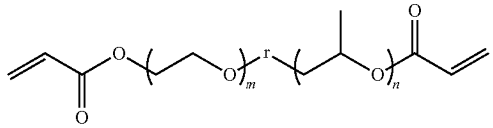

wherein -r- is a reference symbol representing random copolymerization, which was synthesized by the procedure shown below (weight average molecular weight: 16000, mixture in which m in the formula (1-8) is an integer of approximately 246±5 and n is an integer of approximately 105±5, viscosity at 25° C.: 55 Pa·s)

(B-1) 4-Hydroxybutyl acrylate (manufactured by Osaka Organic Chemical Industry, Ltd.)

(B-2) Isodecyl acrylate ("FA111A" manufactured by Hitachi Chemical Co., Ltd.)

(C) Plasticizer ("TACKIFIER KE359" manufactured by Arakawa Chemical Industries, Ltd.)

(D) Phenol-based oxidation inhibitor ("ADEKASTAB AO-80" manufactured by ADEKA Corp.)

(E-1) Filler made of alumina ("ADVANCED ALUMINAAA-18" manufactured by Sumitomo Chemical Co., Ltd.)

(E-2) Filler made of alumina ("ADVANCED ALUMINA AA-3" manufactured by Sumitomo Chemical Co., Ltd.)

(E-3) Filler made of alumina ("ADVANCED ALUMINAAA-04" manufactured by Sumitomo Chemical Co., Ltd.)

(F) Silane coupling agent ("KBM-5803" manufactured by Shin-Etsu Chemical Co., Ltd.)

Synthesis of Compound Represented by Formula (1-7)

A 500-mL flask configured to contain a stirrer, a thermometer, a nitrogen gas inlet tube, a discharge tube, and a heating jacket was used as a reactor, 225 g of a glycol having a polyoxyalkylene chain ("NEWPOL 75H-90000" manufactured by Sanyo Chemical Industries, Ltd.) and 300 g of toluene were added to the reactor, the mixture was stirred at 45° C. and a speed of stirring rotation of 250 times/min, nitrogen was caused to flow at a rate of 100 mL/min, and the mixture was stirred for 30 minutes. Subsequently, the temperature was decreased to 25° C., after completion of temperature decrease, 2.9 g of acryloyl chloride was added dropwise to the reactor, and the mixture was stirred for 30 minutes. Subsequently, 3.8 g of triethylamine was added dropwise thereto, and the mixture was stirred for 2 hours. Subsequently, the temperature was increased to 45° C., and the mixture was reacted for 2 hours. The reaction liquid was filtered, the filtrate was subjected to solvent removal, and a compound represented by the formula (1-7) was obtained.

Synthesis of Compound Represented by Formula (1-8)

The compound represented by the formula (1-8) was obtained by the same method as the method for synthesizing the compound represented by the formula (1-7), except that the glycol having a polyoxyalkylene chain ("NEWPOL 75H-90000" manufactured by Sanyo Chemical Industries, Ltd.) was changed to 240 g of polyoxyethylene polyoxypropylene glycol (molecular weight 16000).

Preparation of Curable Composition Set

The common components and an oxidizing agent (oxidizing agent 1: cumene hydroperoxide (containing about 20% aromatic hydrocarbon) (Tokyo Chemical Industry Co., Ltd.) or oxidizing agent 2: 1,1,3,3-tetramethylbutyl hydroperoxide ("Trigonox TMBH-L" manufactured by Kayaku Nouryon Corporation)) were mixed in a blending amount (parts by mass) shown in Table 1 to obtain a first liquid.

In addition, the common components and a reducing agent (ethylene thiourea) were mixed in a blending amount (parts by mass) shown in Table 1 to obtain a second liquid. The amounts of the common components shown in Table 1 are the amounts of each of the first liquid and second liquid.

Evaluation of Curing Time

The curing time was evaluated using a rheometer (manufactured by Anton Paar). The first liquid and the second liquid were mixed at the mixing mass ratio shown in Table 1 to obtain a mixture (curable composition) of the first liquid and the second liquid. About 1.5 g of the curable composition was weighed in a disposable sample dish of the rheometer (Anton Paar), and the distance between the disposable dish and the disposable plate D-PP25 (manufactured by Anton Paar) was adjusted so that the thickness of the curable composition was 0.5 mm. After removing the excess curable composition on the disposable dish, the disposable plate was vibrated at 1 Hz with a strain of 2% and the measurement started with the sample kept constant at 25° C. The time from the start of measurement to the rise of the storage modulus value was defined as the curing time.

Measurement of Thermal Conductivity

The first liquid and the second liquid were mixed at the mixing mass ratio shown in Table 1 to obtain a mixture of the first liquid and the second liquid (curable composition). Next, the curable composition was filled in a 10 cm×10 cm×0.2 mm mold (made of a SUS plate), covered with a SUS plate, and then cured by heating at 50° C. for 30 minutes to obtain a cured product of the curable composition set (a cured product of the mixture of the first liquid and the second liquid) having a thickness of 0.2 mm. The obtained cured product was cut into a square having a size of 10 mm×10 mm×0.2 mm and was subjected to a blackening treatment by graphite spraying, and then the diffusivity of heat was measured by a xenon flash method ("LFA447 nanoflash" manufactured by NETZSCH-Geratebau GmbH, Selb/Bayern) under the conditions of 25° C. From the product of this value, the density measured by the Archimedean method, and the specific heat at 25° C. measured with a differential scanning calorimeter ("DSC250" manufactured by TA Instruments, Inc.), the thermal conductivity in the thickness direction of the cured product was determined based on the following formula.

Thermal conductivity $\lambda$ (W/(m·K))=$\alpha\times\rho\times Cp$ $\alpha$: Thermal diffusivity ($m^2/s$)

$\rho$: Density ($kg/cm^3$)

Cp: Specific heat (capacity) (kJ/(kg-K))

Measurement of Tensile Modulus, Elongation at Break, and Breaking Strength

The tensile modulus, elongation at break, and breaking strength of the cured product at 25° C. were measured using a tensile tester ("Autograph EZ-TEST EZ-S" manufactured by SHIMADZU CORPORATION). Regarding the measurement, measurement was performed for a cured product having a shape of 0.2 mm (thickness)×5 mm (width)×30 mm (length) based on JIS K7161 under the conditions of a distance between chucks of 20 mm and a tensile rate of 5 mm/min.

For the cured products of Examples 1 to 9, the measurement results for various physical properties are shown in Table 1.

TABLE 1

| | | | Example | | | | | | | | |
|---|---|---|---|---|---|---|---|---|---|---|---|
| | | | 1 | 2 | 3 | 4 | 5 | 6 | 7 | 8 | 9 |
| Blending amount (parts by mass) | Common components of first liquid and second liquid | (A-1) | 1.31 | 1.31 | 1.31 | 1.18 | 1.18 | 1.18 | 1.18 | 1.06 | — |
| | | (A-2) | — | — | — | — | — | — | — | — | 1.18 |
| | | (B-1) | 0.66 | 0.66 | 0.66 | 0.59 | 0.59 | 0.59 | 0.59 | 0.53 | 0.59 |
| | | (B-2) | 2.08 | 2.08 | 2.08 | 1.97 | 1.97 | 1.97 | 1.97 | 1.77 | 1.97 |
| | | (C) | 0.33 | 0.33 | 0.33 | 0.20 | 0.20 | 0.20 | 0.20 | 0.18 | 0.20 |
| | | (D) | 0.26 | 0.26 | 0.26 | 0.24 | 0.24 | 0.24 | 0.24 | 0.21 | 0.24 |
| | | (E-1) | 31.51 | 31.51 | 31.51 | 31.51 | 31.51 | 31.51 | 31.51 | 31.51 | 31.51 |
| | | (E-2) | 11.46 | 11.46 | 11.46 | 11.46 | 11.46 | 11.46 | 11.46 | 11.46 | 11.46 |
| | | (E-3) | 4.78 | 4.78 | 4.78 | 4.78 | 4.78 | 4.78 | 4.78 | 4.78 | 4.78 |
| | | (F) | 0.02 | 0.02 | 0.02 | 0.02 | 0.02 | 0.02 | 0.02 | 0.02 | 0.02 |
| | First liquid | Oxidizing agent 1 | 0.38 | 0.19 | 0.10 | 0.09 | 0.14 | 0.18 | — | — | — |
| | | Oxidizing agent 2 | — | — | — | — | — | — | 0.10 | 0.09 | 0.10 |
| | Second liquid | Reducing agent | 0.14 | 0.07 | 0.04 | 0.03 | 0.05 | 0.07 | 0.04 | 0.03 | 0.04 |
| Mixing mass ratio of first liquid:second liquid | | | 1:1 | 1:1 | 1:1 | 1:1 | 1:1 | 1:1 | 1:1 | 1:1 | 1:1 |
| Blending amount of filler (% by volume) | | | 76 | 76 | 76 | 78 | 78 | 78 | 78 | 80 | 78 |
| Curing time (minutes) | | | 7 | 11 | 25 | 30 | 17 | 10 | 49 | 59 | 48 |
| Thermal conductivity (W/(m · K)) | | | 3 | 3.1 | 3 | 3.1 | 3.1 | 3.2 | 3.9 | 4.3 | 3.5 |
| Tensile modulus (MPa) | | | 12 | 11.5 | 11.2 | 14.3 | 11.9 | 11.9 | 7.5 | 10.1 | 6.8 |
| Elongation at break (%) | | | 11.2 | 12.1 | 11.3 | 10.9 | 14.7 | 14.5 | 22.6 | 19.4 | 25.8 |
| Breaking strength (MPa) | | | 1.3 | 1.3 | 1.3 | 1.6 | 1.5 | 1.4 | 1.1 | 1.4 | 1.1 |

As can be seen from Table 1, when the curable composition set contained the compound represented by the formula (1), a cured product having low elasticity and excellent elongation (low tensile modulus and high elongation at break) was obtained.

REFERENCE SIGNS LIST

1A, 1B: electronic component, 11: cured product of curable composition set, 21: semiconductor chip (heat source), 22: heat sink, 23: substrate, 24: underfill, 25: heat spreader.

The invention claimed is:

1. A curable composition set comprising:

a first liquid comprising an oxidizing agent; and a second liquid comprising a reducing agent, wherein the first liquid and the second liquid each further comprise a compound represented by the following formula (1):

(1)

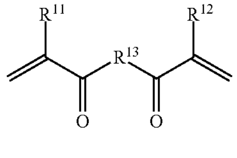

wherein $R^{11}$ and $R^{12}$ each independently represent a hydrogen atom or a methyl group, and $R^{13}$ represents a divalent group having a polyoxyalkylene chain, wherein the first liquid and the second liquid each still further comprise a thermally conductive filler having a thermal conductivity of 10 W/m·K or higher, and wherein a content of the thermally conductive filler is 60% by mass or more based on the sum of the first liquid and the second liquid.

2. The curable composition set according to claim 1, wherein the polyoxyalkylene chain comprises a structural unit represented by the following formula (2):

(2)

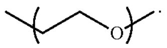

3. The curable composition set according to claim 1, wherein the polyoxyalkylene chain comprises a structural unit represented by the following formula (3):

(3)

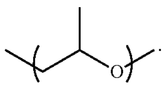

4. The curable composition set according to claim 1, wherein the polyoxyalkylene chain is a copolymer chain comprising a structural unit represented by the following formula (2) and a structural unit represented by the following formula (3):

(2)

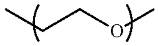

-continued (3)

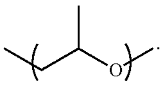

5. The curable composition set according to claim 4, wherein the copolymer chain is a random copolymer chain.

6. The curable composition set according to claim 1, wherein the compound represented by the formula (1) has a weight average molecular weight of 5000 or more.

7. The curable composition set according to claim 1, wherein the polyoxyalkylene chain has 100 or more of oxyalkylene groups.

8. The curable composition set according to claim 1, wherein the compound represented by the formula (1) has a viscosity at 25° C. of 1000 Pa·s or less.

9. The curable composition set according to claim 1, further comprising an oxidation inhibitor.

10. The curable composition set according to claim 9, wherein the oxidation inhibitor is a phenol-based oxidation inhibitor.

11. The curable composition set according to claim 1, wherein a content of the compound represented by the formula (1) is 1 to 20% by mass based on the sum of the first liquid and the second liquid.

12. The curable composition set according to claim 1, wherein both of the first liquid and the second liquid further comprise an additional polymerizable compound having one (meth)acryloyl group.

13. The curable composition set according to claim 12, wherein a content of the additional polymerizable compound is 1 to 20% by mass based on the sum of the first liquid and the second liquid.

* * * * *